US010826487B2

(12) United States Patent
Lin et al.

(10) Patent No.: US 10,826,487 B2
(45) Date of Patent: Nov. 3, 2020

(54) POWER UNIT WITH AN INTEGRATED PULL-DOWN TRANSISTOR

(71) Applicant: TEXAS INSTRUMENTS INCORPORATED, Dallas, TX (US)

(72) Inventors: Haian Lin, Bethlehem, PA (US); Frank Alexander Baiocchi, Allentown, PA (US); Scott Edward Ragona, Philadelphia, PA (US); Jonathan Almeria Noquil, Bethlehem, PA (US)

(73) Assignee: Texas Instruments Incorporated, Dallas, TX (US)

( * ) Notice: Subject to any disclaimer, the term of this patent is extended or adjusted under 35 U.S.C. 154(b) by 19 days.

(21) Appl. No.: 15/831,623

(22) Filed: Dec. 5, 2017

(65) Prior Publication Data

US 2019/0173464 A1 Jun. 6, 2019

(51) Int. Cl.
| | |
|---|---|
| *H02M 3/158* | (2006.01) |
| *H03K 17/687* | (2006.01) |
| *H03K 17/16* | (2006.01) |
| *H03K 17/06* | (2006.01) |
| *H03K 17/0412* | (2006.01) |

(52) U.S. Cl.
CPC ........ *H03K 17/687* (2013.01); *H02M 3/1582* (2013.01); *H03K 17/04123* (2013.01); *H03K 17/063* (2013.01); *H03K 17/165* (2013.01); *H03K 17/163* (2013.01); *H03K 2017/066* (2013.01)

(58) Field of Classification Search
CPC ......... H02M 1/08; H02M 1/088; H02M 1/096
See application file for complete search history.

(56) References Cited

U.S. PATENT DOCUMENTS

| | | | |
|---|---|---|---|
| 6,377,107 B1 * | 4/2002 | Franck | H02M 7/5383 315/209 R |
| 7,088,131 B1 | 8/2006 | Stout et al. | |
| 7,420,247 B2 | 9/2008 | Xu et al. | |
| 2004/0041151 A1 * | 3/2004 | Rice | H03K 17/04123 257/67 |
| 2006/0250183 A1 | 11/2006 | Zhao et al. | |
| 2006/0250188 A1 | 11/2006 | Kaya | |
| 2011/0148376 A1 * | 6/2011 | Xu | H02K 17/165 323/282 |
| 2011/0210708 A1 * | 9/2011 | Herbsommer | H01L 23/49524 323/271 |

(Continued)

FOREIGN PATENT DOCUMENTS

JP 01154620 A 6/1989

OTHER PUBLICATIONS

Juan A. Herbsommer, et al., "Innovative 3D Integration of Power MOSFETs for Synchronous Buck Converters", IEEE, 2 pgs.

(Continued)

*Primary Examiner* — Jeffrey A Gblende
*Assistant Examiner* — Lakaisha Jackson
(74) *Attorney, Agent, or Firm* — Lawrence J. Bassuk; Charles A. Brill; Frank D. Cimino (57) ABSTRACT

One example relates to a circuit that includes a first integrated circuit die and a second integrated circuit die. The first integrated circuit die has a power field effect transistor (FET) and a pull-down FET coupled to the power FET. The second integrated circuit die has a pull-up FET coupled to the power FET.

15 Claims, 5 Drawing Sheets

(56) References Cited

U.S. PATENT DOCUMENTS

2014/0015586 A1\* 1/2014 Hirler ............... H01L 29/42372
327/333
2018/0013422 A1\* 1/2018 Leong ................ H03K 17/6871

OTHER PUBLICATIONS

Boyi Yang, et al., "NexFET Generation 2, New Way to Power", IEEE, 2011, 4 Pgs.
Search Report for PCT Application No. PCT/US18/64084, international search report dated Mar. 14, 2019, 1 page.
Machine Translation for JP01154620A, 6 pages.

\* cited by examiner

POWER UNIT WITH AN INTEGRATED PULL-DOWN TRANSISTOR

TECHNICAL FIELD

This disclosure relates generally to power electronics and, more specifically, to a power unit with an integrated pull-down transistor.

BACKGROUND

As computers and other devices are being made with high power demand components, power density and high efficiency become design considerations with increasing importance. These design considerations are further applicable to power circuitry, such as DC-DC converters and the like. In such power circuitry, minimizing power losses at higher switching frequencies is desirable. For example, power loss can arise from switching loss from high-side switches, conduction loss from both the high-side and low-side switches, and diode conduction loss from the low-side switches during dead time. On the other hand, in some power conversion circuitry, parasitic inductance and resistance have become practical design considerations. For example, bond wire induced parasitic gate inductance will increase the turn-off time of the switches, which in turn will increase the switching loss or diode conduction loss. Furthermore, due to the parasitic inductance, faster switching may lead to higher voltage ringing which occurs on the phase node of a buck converter and may introduce a type of circuitry malfunction called shoot-through, electro-magnetic interference (EMI) related problems, and/or undesired power stress to power switches.

SUMMARY

One example relates to a circuit that includes a first integrated circuit (IC) die and a second IC die. The first IC die has a power field effect transistor (FET) and a pull-down FET coupled to the power FET. The second IC die has a pull-up FET coupled to the power FET.

Another example relates to another circuit that includes first, second, and third IC dies. The first IC die has a low-side power field effect transistor (FET) and a low-side pull-down FET coupled to the low-side power FET. The second IC die has a high-side power FET and a high-side pull-down FET coupled to the high-side power FET. The third IC die has a low-side pull-up FET that is coupled to the low-side power FET and a high-side pull-up FET that is coupled to the high-side power FET.

Yet another example relates to yet another circuit that includes first and second IC dies. The first IC die has a low-side power field effect transistor (FET), a high-side power FET, a low-side pull-down FET coupled to the low-side power FET, and a high-side pull-down FET coupled to the high-side power FET. The second IC die has a low-side pull-up FET coupled to the low-side power FET and a high-side pull-up FET that is coupled to the high-side power FET.

DETAILED DESCRIPTION

The disclosure relates to a power switching circuit that includes a driver integrated circuit (IC) die, and a power field effect transistor (FET) die with an integrated pull-down field effect transistor (FET) for a switching power application, such as a DC-DC (e.g., buck or boost) converter. As one example, a circuit includes a driver IC implemented on the first die, and a power FET implemented on the second die, on which a pull-down FET is integrated along with this power MOSFET. By integrating the pull-down FETs onto a same die as the power FETs, a length of an electrical connection coupling the pull-down FETs and the power FETs is minimized. This minimization mitigates parasitic inductance from gate wires of the power FETs during a turn-off cycle of the power FETs. By mitigating parasitic inductance from gate wires of the power FET, switching speed of the power FETs increases while reducing switching losses during the turn off-cycle. This power switching circuit can be used as a building block for many switching power applications.

One of those applications is a DC-DC buck converter. As one example, a circuit includes a first integrated circuit die and a second integrated circuit die. The first integrated circuit die has a power field effect transistor (FET) and a pull-down FET coupled to the power FET. The second integrated circuit die has a pull-up FET coupled to the power FET. In an example, these dies are assembled in the same package and disposed on a lead frame. In an example, a high-side power FET die with an integrated high-side pull-down FET is stacked on a low-side power FET. The source of the low-side power FET is disposed on the bottom side of the low-side power FET die and is electrically connected to ground pins of the package. A first clip is placed between a source of the high-side power FET and a drain of the low-side power FET. The first clip electrically connects the source of the high-side power FET and the drain of the low-side power FET to phase node pins of the package. A second clip is placed on a top side of the high-side power FET die. The second clip electrically connects a drain of the high-side power FET to power input pins of the package. Bond wires are used to electrically connect the drive IC die to both the low-side and high-side power FETs, along with their associated pull-down FETs. Bond wires are also used to electrically connect a driver IC die that includes pull-up FETs to several of the package pins for a control circuitry to receive and output signals.

Figure 1:
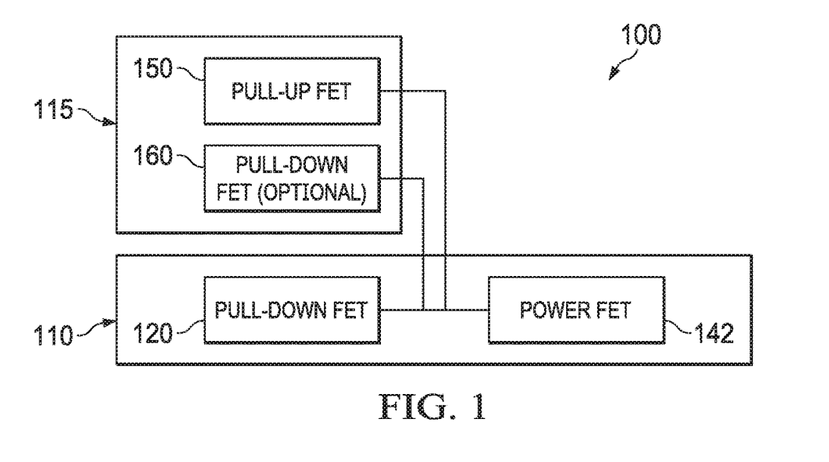
FIG. 1 illustrates an example circuit for a switching power application.

FIG. 1 illustrates an example circuit 100 for a switching power application, e.g., a power switch that is used as a building block for switching power applications such as DC-DC power converters. The example circuit 100 includes a power unit 110 and a driver circuit 115 coupled to the power unit 110. The power unit 110 may be implemented on a first IC die, e.g., a power die, and the driver circuit 115 may be implemented on a second IC die, e.g., a driver die, a die being a small block of semiconducting material, on which a given functional circuit is fabricated. Typically, integrated circuits are produced in large batches on a single wafer of electronic-grade silicon (EGS) or other semiconductor (such as GaAs and GaN) through processes such as photolithography. The wafer is cut ("diced") into many pieces, each containing one copy of the circuit. Each of these pieces is called a die. The power unit 110 includes a power FET 142 (e.g. an n channel power FET). The power unit 110 further includes a pull-down FET 120 (e.g., an n channel pull-down FET) that is implemented on the power die and is coupled to the power FET 142. The pull-down FET 120, when it is on, will discharge the gate of the power FET 142 and turn the power FET 142 off.

The power FET 142 could be a metal-oxide-field-effect-transistor (MOSFET), or any other type of FET. For example, the power FET 142 can handle significant power levels, with such a device typically subject to higher current(s) and higher voltage(s) than a typical FET. For example, the power FET 142 could include a drift region next to a channel to support the higher voltage(s), and a higher channel density to handle the high current(s). Since a typical power FET handles high current, it is typically a discrete device with a separate drain and source on different sides of the silicon die. For example, the power FET 142 has its drain on the top surface of the die and its source on the bottom surface the die. In such a configuration current will flow from the drain (top surface), through a drift lightly-doped drain (LDD) region and the gate controlled channel, to the source (bottom surface). For a typical drain down FET this is reversed. In accordance with the example circuit 100, the pull-down FET 120 is integrated with the power FET 142 onto a same die to improve the performance. Implementing the power FET 142 as a source down device, the drain-source voltage (VDS) may be rated from 12V to 30V. The gate-to-source voltage (VGS) may be rated from 8-20V. In some applications the power FET 142 may have a much higher VDS rating, e.g., 60-100V for medium voltage product and 200-100V, or even higher for high voltage applications. The power FET 142 may have a max continuous current that is several tens of amps, up to 100 A, or even higher depending on the die size, package and thermal design of the power FET 142, with the power FET 142 being fully on when handling such large current. An extremely low on resistance of the power FET 142 may have a power dissipation up to 10-15 W.

The driver circuit 115 is implemented on at least one other die than the die that the power unit 110 is implemented on. The driver circuit 115 includes a pull-up FET 150 that is electrically coupled to the power FET 142. The pull-up FET 150, when it is on, will allow a driving signal to charge the gate of the power FET 142 and turn the power FET 142 on. In an example, the driver circuit 115 also includes an optional pull-down FET 160. The optional pull-down FET 160 is optionally utilized to provide additional pull-down capability. In an example, the pull-up FET 150 is also integrated onto a same die as the pull-down FET 160 and the power FET 142, resulting in similar benefits as integrating the pull-down FET 160 and the power FET 142 onto a same die. In such an example where the pull-up FET 150 is a p channel FET and the power FET 142 is an n channel FET, additional process steps would be utilized to form such FETs onto a same die. For example, the pull-up and pull-down FETs 150/120 may be typical CMOS FETs. Both the VGS and VDS for these FETs could be <10V. For example, both the VDS and VGS for such devices will be around 5V experiencing dynamic current flow while functioning to charge and discharge the gate of the power FET 142.

Figure 2:
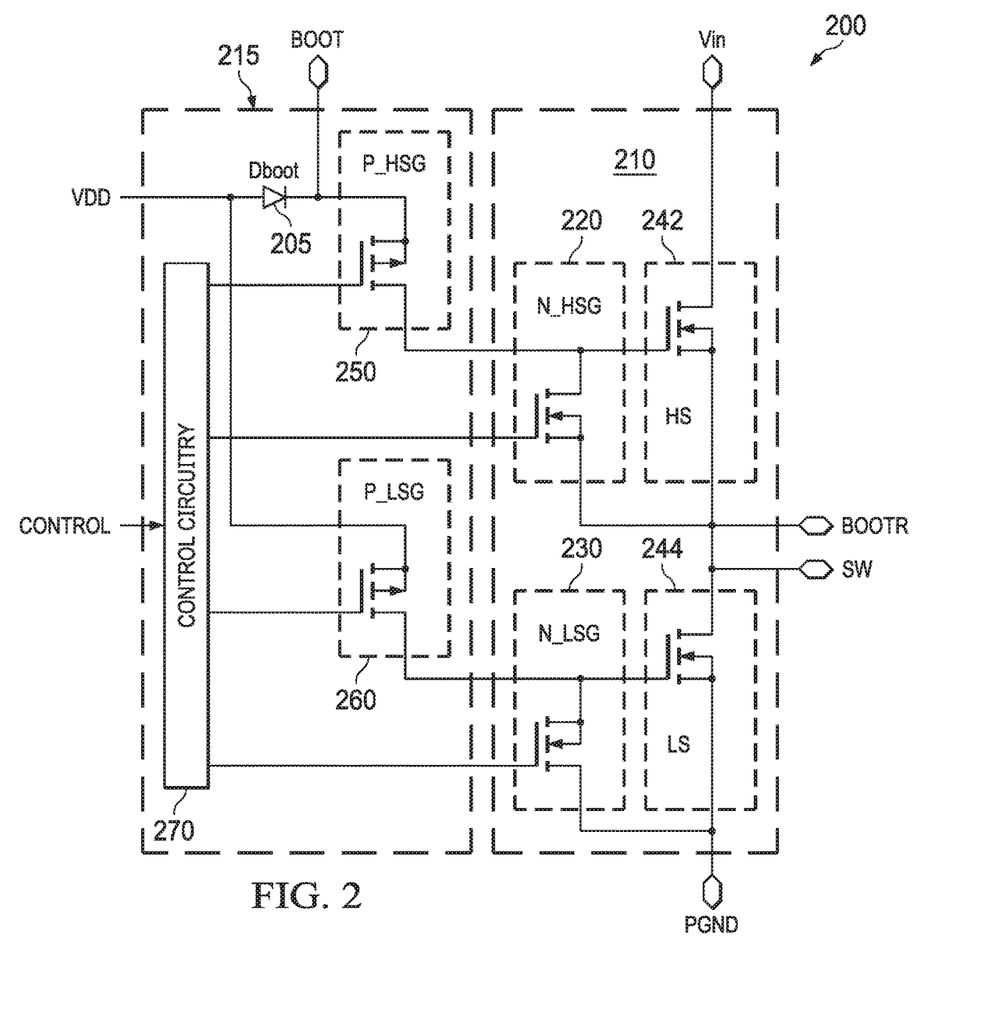
FIG. 2 illustrates an example circuit for a DC-DC buck converter which includes pull-down FETs integrated onto a same die as power MOSFETs.

FIG. 2 illustrates example circuit 200 for a DC-DC buck converter which includes pull-down FETs integrated onto a same die as power MOSFETs. In this example, a power unit 210 includes a high-side power FET 242 (e.g., an n-channel metal-oxide-semiconductor (MOS) FET) that is coupled to a low-side power FET 244 (e.g., an n-channel MOSFET). The power unit 210 further includes a high-side pull-down FET 220 (e.g., an n-channel MOSFET) that is coupled to the high-side power FET 242. Likewise, a low-side pull-down FET 230 (e.g., an n-channel MOSFET) is coupled to the low-side power FET 244. The high-side pull-down FET 220, the low-side pull-down FET 230, the high-side power FET 242, and the low-side power FET 144 are integrated onto a first die, e.g., a same power die. This configuration of the circuit 200, which builds on the circuit configuration shown in FIG. 1, the power FETs 242/244 can discharge through localized pull-down FETs 220/230 and therefore avoid the impact of the parasitic inductance from the bond wires that would have been required to connect the drain of the pull-down FETs if they had not been located on the driver IC and the gate of power FETs 242/244.

As a further example, the high-side power FET 242 includes a drain terminal that is coupled to an input voltage Vin. The high-side power FET 242 further includes a bulk terminal and a source terminal that are both coupled to BOOTR and SW terminals, with the BOOTR terminal providing a return path for the high-side drivers and the SW terminal providing a phase node that couples the high-side power FET 242 and the low-side power FET 244. A high-side pull-down FET 220 is coupled to the high-side power FET 242. The drain of the high-side pull-down FET 220 is coupled to the gate of the high-side power FET 242. A gate of the high-side pull-down FET 220 is coupled to a control circuitry 270. The source of the high-side pull-down FET 220 is also coupled to the BOOTR and SW terminals. The control circuitry 270 generates activation voltages to activate pull-up FETs 250/260 (e.g., p channel MOSFETs) and pull-down FETs 220/230, which in turn drive the power FETs 242/244. The control circuitry 270 is coupled to gates of the pull-up FETs 250/260 and gates of the pull-down FETs 220/240. The control circuitry 270 receives control signals that control output of various activation voltages to such gates.

The low-side power FET 244 includes a drain terminal that is coupled to the BOOTR and SW terminals. The low-side power FET 244 further includes a bulk terminal and a source terminal that are both coupled to a power ground PGND terminal. A low-side pull-down FET 230 is coupled to the low-side power FET 244. The drain of the low-side pull-down FET 230 is coupled to a gate of the low-side power FET 244. The gate of the low-side pull-down FET 230 is coupled to the control circuitry 270. All FETs in power unit 210 can be either integrated in a single power die, or separated into two dies, a high-side power die including FETs 242/220 and a low-side power die including FETs 244/230.

The circuit 200 further includes a driver circuit 215. The driver circuit 215 is implemented on a second die, which is different from the power die. The driver circuit 215 includes a high-side pull-up FET 250. A drain and bulk terminals of the high-side pull-up FET 250 are both coupled to a BOOT terminal and a cathode of a bootstrap diode 205. The BOOT terminal is typically coupled to capacitor (not shown) that provides a charge to turn on the high-side pull-up FET 250. A source of the high-side pull-up FET 250 is coupled to the drain of the high-side pull-down FET 220. A gate of the high-side pull-up FET 250 is coupled to the control circuitry 270. All FETs in the driver circuit 215 can be either integrated in a single driver die, or separated into two dies, a high-side driver die including FET 250 and a low-side driver die including FET 260.

The driver circuit 215 further includes a low-side pull-up FET 260. A drain and bulk terminals of the low-side pull-up FET 260 are both coupled to a positive drain voltage VDD terminal. An anode of the bootstrap diode 205 is coupled to the VDD terminal and the drain of the low-side pull-up FET 260. A source of the low-side pull-up FET 260 is coupled to the drain of the low-side power FET 244. A gate of the low-side pull-up FET 260 is coupled to the control circuitry 270.

Figure 3:
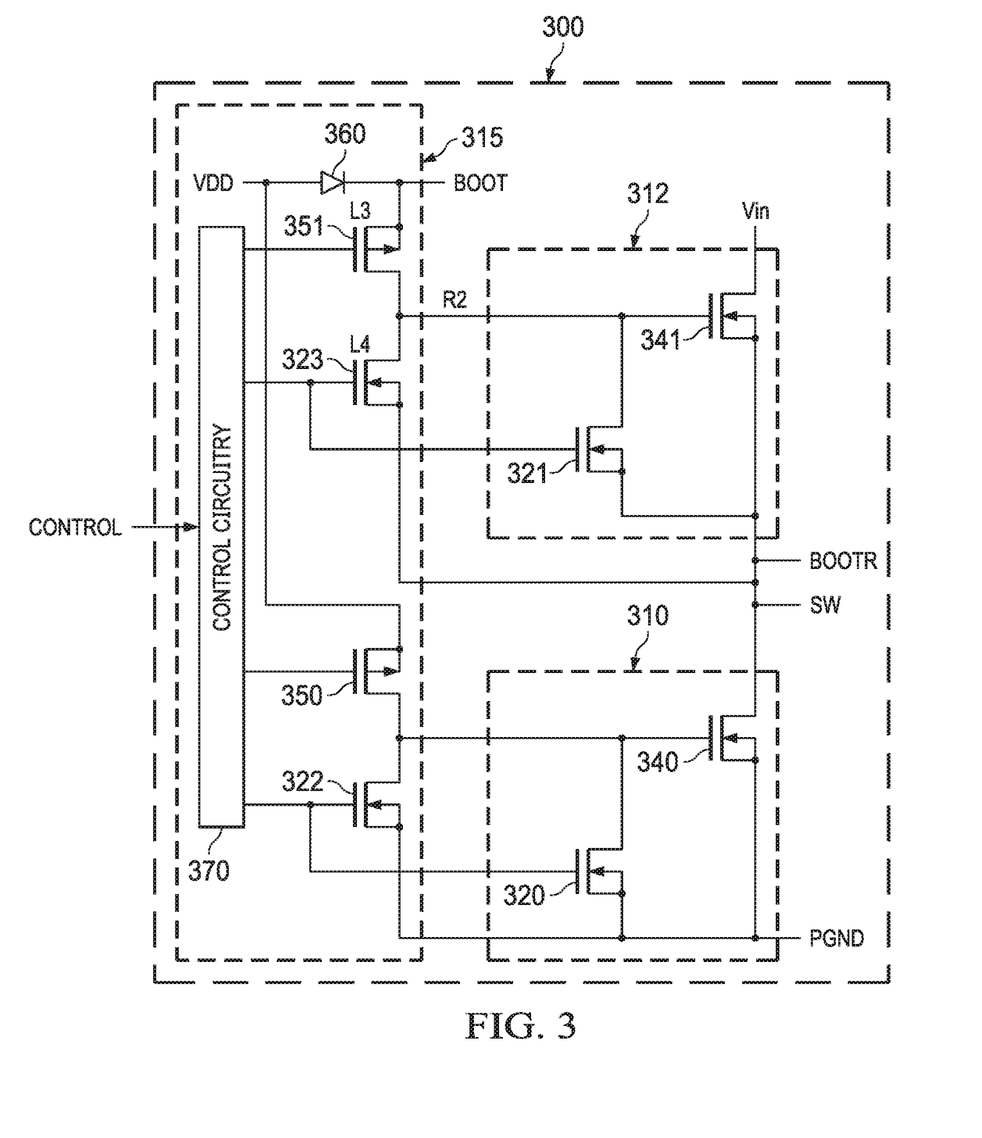
FIG. 3 illustrates another example circuit for a DC-DC buck converter which includes pull-down FETs integrated onto a same die as power MOSFETs.

FIG. 3 illustrates another example circuit 300 for DC-DC buck converter which includes pull-down FETs integrated with the power MOSFETs. The circuit 300 includes similar components implemented in a similar configuration as the circuits 100/200 and achieves similar advantages as the circuits 100/200. In this example, the circuit 300 includes a first die that includes a driver circuit 315, a high-side power unit die 312, as well as a low-side power unit die 310 that is coupled to the high-side power unit die 312. Both the high-side power unit die 312 and low-side power unit die 310 include a power FET and an associated pull-down FET which is integrated with and coupled to the power FET. Thus, the high-side power unit die 312 includes the high-side power FET 341 and the high-side pull-down FET 321, and likewise the low-side power unit die 310 includes the low-side power FET 340 and the low-side pull-down FET 320.

The driver circuit 315 is coupled to both the high-side and low-side power unit dies 312/310. The driver circuit 315 also includes control circuitry 370, a high-side pull-up FET 351, a high-side pull-down FET 323, a low-side pull-up FET 350, a low-side pull-down FET 322. The control circuitry 370 generates control signals to control activation of the pull-up FETs 350/351 and pull-down FET 320/322/321/323, which in turn drive the power FETs 340/341. With this configuration, low-side and high-side power unit dies 310/312 mitigate parasitic inductance and resistance from gate connections of the power FETs 340/341 during a turn-off cycle of the power FETs 340/341 which increases turn-off switching speed of the power FETs 340/341. In implementations in which a pull-down FET 320 is integrated with the power FET 340 or a pull-down FET 321 is integrated with the power FET 341, the pull-down FETs 322 or 323 become redundant and are therefore optional. However, an advantage is realized utilizing the pull-down FETs 322/323 in that these additional pull-down FETs provide an additional discharging path to further improve turn-off speed of the power FETs 340/341. In an example, the pull-down FETs 322/323 are integrated on the driver circuit 215 in the configuration shown in FIG. 3.

The drain of the FET 351 is connected to a BOOT terminal and a cathode of a bootstrap diode 360. The drain of the FET 350 is connected to a VDD terminal and an anode of a bootstrap diode 360. The gates of FETs 351, 323, 350 and 322 are individually electrically connected to control circuitry 370. The sources of the FETs 340/320/322 are electrically connected to the package ground PGND terminal. As a further example, the high-side power FET 341 includes a drain terminal that is coupled to a DC input voltage Vin. The sources of the FETs 321/341/323 are electrically connected to the drain of the FET 340, the SW terminal, and BOOTR terminal, with the BOOTR terminal providing a return path for the high-side drivers and the SW terminal providing a phase node.

Figure 4:
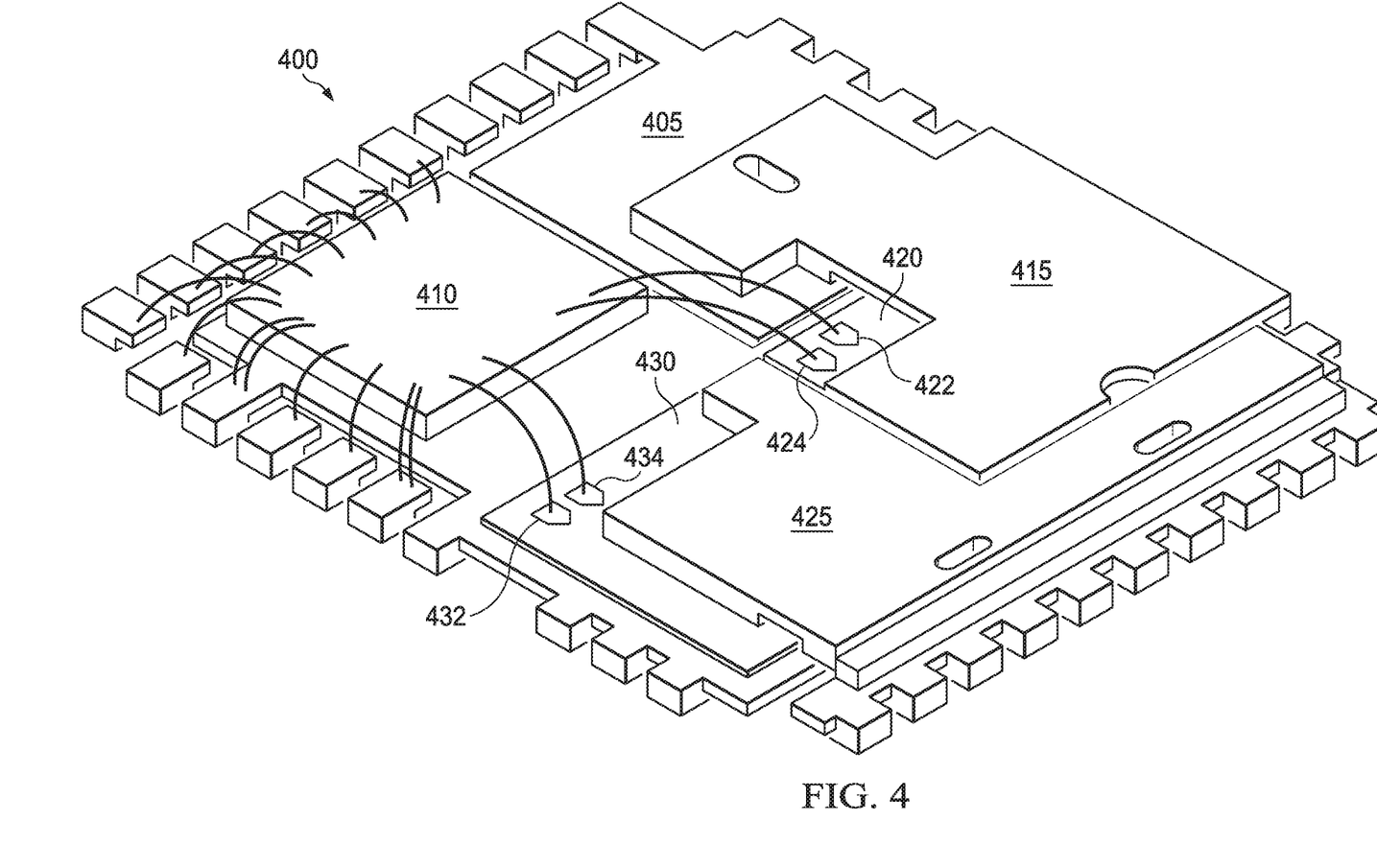
FIG. 4 illustrates an example integrated circuit package.

In some examples, with reference to FIGS. 1-3, the power FETs 142/242/244/341/340 are source-down n-channel power FETs. The pull-down FETs 120/220/230/321/320 are also source-down n-channel FETs with the similar device structures to the source-down power FETs. The pull-down FETs 323/322 are n-channel FETs and the pull-up FETs 351/350 are p-channel FETs. The circuit 300, with addition of an integrated pull-down FET 220/230/321/320 to a power FET 142/242/244/341/340, does not include an additional process step change to implement, no mask layer addition to implement, and no package change to implement as compared to a typical power unit. The circuits 100/200/300 further include minor design modification on a driver circuit to implement based on a location of various components and minor assembly adjustment for an addition of bond wires (e.g., as shown in FIG. 4). The circuits 100/200/300 include a minor die size addition to include the pull-down FETs 220/230/321/320 to one that already includes the power FETs 142/242/244/341/340.

In an example, the power FET 142/242/244/341/340 is a source down power FET. The source down power FET simplifies a stack die package which bring advantages, such as higher packing density, improved thermal properties, lower parasitic inductance, etc. Many stack die packages utilize drain down FETs. In such a case, both the high-side and low-side power FET are flipped. Use of source down FETs prevents such FETs from having to be flipped, allow easier access to gate pads for both power FETs and pull-down FETs. In addition, this configuration simplifies connection of the driver circuit 215 to the gate pads with bond wires. Moreover, with integration of the pull-down FET 220/230/321/320 with the power FET 142/242/244/341/340, the pull-down FET 220/230/321/320 shares the source with the power FET 142/242/244/341/340 and has an isolated drain so that the drain of the pull-down FET 220/230/321/320 is connected to the gate of the power FET 142/242/244/341/340. Such a configuration is simplified with use of a source down power FET. Typical devices using a drain down power FET that provides no simplified way to isolate the drain with a high gate charge due to its device structure. Such high gate charge is a road block in pursuing high frequency switching applications. As a result, turn-off time of the power FET 142/242/244/341/340 is not a concern for such typical devices. The power FET 142/242/244/341/340 implemented as a source down power FET has improved gate charge due to its lateral structure and therefore allow application to high frequency switching applications where the turn-off time of the power FET 142/242/244/341/340 is a consideration.

The control circuitry 370 generates control signals to control the pull-up FETs 350/351 and pull-down FETs 320/321, which in turn drive the power FETs 341/340. As an example, the control circuitry 370 will generate a signal to turn-on the pull-up FET 351, and another signal to keep both pull-down FETs 323/321 off concurrently. While the pull-up FET 351 is on, the voltage source (VDD) tied to the drain of the pull-up FET 351 will charge the gate of the power FET 341 and eventually turn-on the power FET 341. When the control circuitry 370 generates a signal to turn-off the pull-up FET 351, and another signal to turn-on both the pull-down FETs 323 and 321 thereafter, the stored charge on the gate of the power FET 341 will be discharged through both the pull-down FETs 323 and 321. As a result, the power FET 341 will be turned off. The low-side of the circuit 300 operates in a similar manner as the high-side of the circuit 300 just described.

In typical circuits, no pull-down FETs 321/320 are integrated onto a same die as the power FETs 341/340. In the typical configuration, stored charges on the gate of the power FETs 341/340 are discharged through the pull-down FETs 323/322 coupled with bond wires. The bond wires introduce parasitic inductance (not shown). Parasitic inductance associated with these bond wires slows down the discharge process. With the addition of the pull-down FETs 321/320 onto a same die as the power FETs 341/340 stored charges can be discharged through pull-down FETs 321/320. The pull-down FETs 321/320 provide a low impedance discharge path for charges stored on gates of the power FETs 341/340, thus avoiding the parasitic inductance during a turn-off cycle of the power FETs 341/340, and therefore increasing turn-off switching speed. With higher switching speed, lower switching power loss is achieved, which is beneficial for switching applications.

With integration of the pull-down FET 321 onto a same die as the high-side power FET 341, the turn-off time of the high-side power FET 341 is reduced along with a reduction in switching power loss. Likewise, with integration of the pull-down FET 320 onto a same die as the low-side power FET 340, the turn-off time of the low-side FET 340 is reduced. The low-side power FET 340 may operate in a so-called soft-switching mode in which switching power loss is negligible. This turn-off time reduction, however, allows tightening of the dead time control, along with better ring control and lower diode conduction loss. The low-side pull-down FET 320 also prevents a capacitive induced change of voltage (CdV/dt) shoot-through of the low-side power FET 340. This allows use of a lower threshold voltage (Vt) of the low-side power FET 340, with a drain-to-source resistance (Rdson) and hot carrier injection (HCI) improvement. The circuits 100/200/300 push down the threshold voltage to improve specific resistance. To achieve a low threshold voltage, the circuits 100/200/300 mitigate the CdV/dT induced FET turn-on problem. To avoid this problem, the circuits 100/200/300 integrate the pull-down FETs 321/320 with the power FETs 341/340, respectively, which provide low inductive discharging paths.

Although not shown, the circuits 100/200/300 also include an integrated circuit (IC) controller that controls operation of the driver circuitry 270/370 and an inductor/capacitor (LC) filter to suppress noise in an output signal. The power FETs and associated pull-down FETs 341/321/340/320 can be either integrated in a single power die, or separated into two dies, a high-side power die including FETs 341/321 and a low-side power die including FETs 340/320. All FETs in the driver circuit 315 can be either integrated in a single driver die, or separated into two dies, a high-side driver die including FETs 351/323 and a low-side driver die including FETs 350/322.

FIG. 4 illustrates an example integrated circuit package 400 that includes a high-side power unit die 420, a low-side power unit die 430, and an integrated driver circuit die 410 that are each implemented on a corresponding IC chip, an IC chip being integrated circuit or monolithic integrated circuit (also referred to as an IC, a chip, or a microchip) of a set of electronic circuits on one small flat piece (or "chip") of semiconductor material, normally silicon. The integrated circuit package 400 includes a ground lead frame 405 onto which integrated driver circuit die 410, the high-side power unit die 420, and the low-side power unit die 430 are mounted. In the example of FIG. 4, the integrated driver circuit die 410 is disposed in a corner of the ground lead frame 405. The integrated driver circuit die 410 can be configured according to the examples disclosed with respect to FIGS. 1-3 or otherwise consistent with this disclosure. The high-side power unit die 420 includes FETs 242/220 or FETs 341/321. The high-side power unit die 420 includes bond pads 422, which is a gate pad of FETs 341/242, and bond pad 424, which is a gate pad of FETs 321/220. For example, bond wires couple the bond pads 422/424 to the integrated driver circuit die 410.

The low-side power unit die 430 includes the FETs 244/230 or FETs 340/320. The low-side power unit die 430 also includes two bond pads 432 and 434 that are coupled to the integrated driver circuit die 410. For example, bond wires electrically couple the bond pads 432 and 434 to corresponding bond pads on the integrated driver circuit die 410. The low-side power unit die 430 is disposed along a same outside edge of the ground lead frame 405 as is disposed the integrated driver circuit die 410. A low-side clip (e.g., copper clip) 425 is disposed atop the low-side power unit die 430. The high-side power unit die 420 will be sitting on the low-side clip 425. A high-side clip (e.g., copper clip) 415 is disposed atop the high-side power unit die 420. The clip 425 will electrically connect the drain of the FET 340, the source of the FET 341, and the output pins (SW in FIG. 3). The clip 415 will connect the drain of the FET 341 and input pins (Vin in FIG. 3). In an example, the entire integrated circuit package 400 may be over-molded with a molding compound (not shown), e.g., epoxy or other insulating compound.

Figure 5:
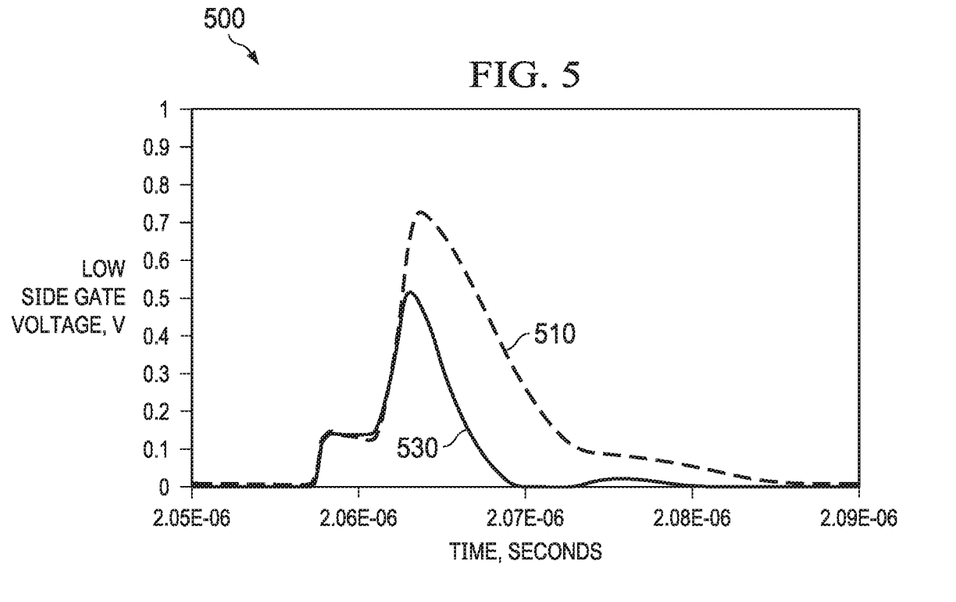
FIG. 5 illustrates an example graph of capacitive induced gate bounce for a low-side power FET.

FIG. 5 illustrates an example graph 500 of capacitive induced gate bounce for a low-side power FET (e.g., FET 244/340). For example, the graph 500 includes two curves, a curve 510 that represents values associated with an implementation of the typical circuits in which the pull-down FETs are integrated onto a same die as the pull-up FETs, and a curve 530 that represents values associated with implementation of the circuits 100/200/300, without the optional FETs 323/322.

The curve 510 represents results from a typical pull-down implementation in which pull-down FETs are implemented on the driver circuit distinct from a power unit (not shown), which results in a highest gate bounce. For example, curve 510 begins to deviate from curves 530 at approximately 0.4 low-side gate voltage and at approximately $2.062^{-06}$ seconds. Curve 510 is at its greatest deviation from curves 530 at its maximum at approximately 0.72 low-side voltage and at approximately $2.0627^{-06}$ seconds.

The curve 530 represents results from a pull-down implementation in which the gate bounce for the low-side power FET 340 is provided by the example circuits 100/200/300. For example, curve 530 begins to deviate from curves 510 at approximately 0.4 low-side gate voltage and at approximately $2.062^{-06}$ seconds. Curve 530 is at its greatest deviation from curves 510 at its maximum at approximately 0.52 low-side gate voltage and at approximately $2.065^{-06}$ seconds. Thus, as can be seen from the curves 510 and 530, implementing the example circuits disclosed herein 100/200/300 results in an approximately 0.2 volt gate bounce reduction as compared to the typical pull-down implementation in which the pull-down FET is implemented on the driver circuit.

Figure 6:
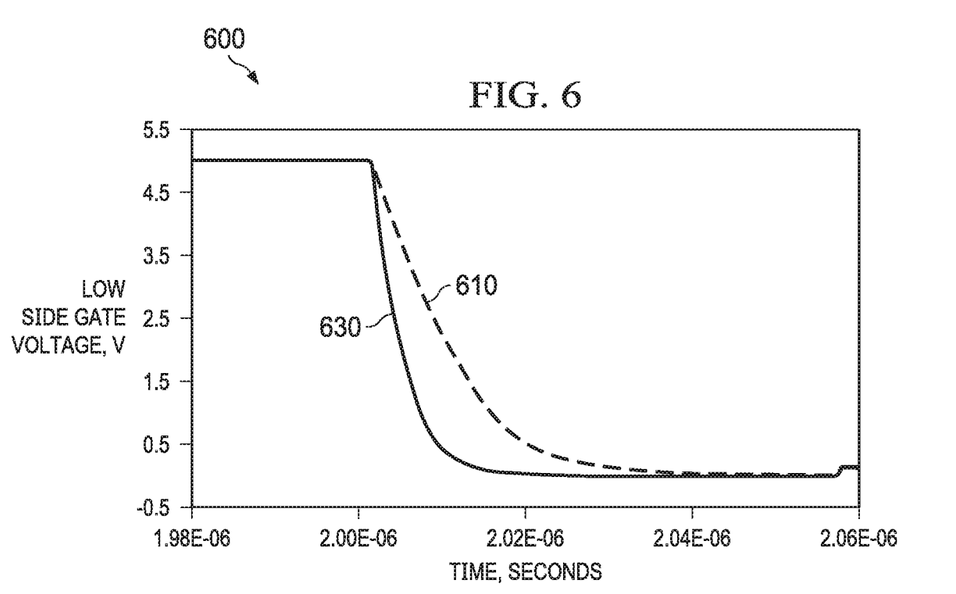
FIG. 6 illustrates an example graph of gate discharging for the low-side power FET.

FIG. 6 illustrates an example graph 600 of gate discharging for a low-side power FET, e.g., the low-side power FETs 244/340. For example, the graph 600 includes two curves, a curve 610 that represents values associated with the typical pull-down implementation discussed above, and a curve 630 that represents values associated with implementation of the circuits 100/200/300 disclosed herein, without optional FETs 323/322. Both curves 610/630 begin at a gate voltage for the low-side power FET 220/340 of approximately 5 V. Switching for both curves occurs at approximately $2.002^{-06}$ seconds.

Curve 610 transitions from its peak of approximately 5 V to their minimum voltage of approximately 0.25 V at approximately $2.03^{-06}$ seconds. In comparison, curve 630 transitions from its peak of approximately 5 V to its minimum voltage of approximately 0.25 V at approximately $1.96^{-06}$ seconds. Thus, graph 600 illustrates that the circuitry 100/200/300 reduces discharging by approximately 7 ns as compared to the typical pull-down implementation, resulting in faster switching of the low-side power FETs 244/340 to an OFF state. Moreover, the circuits 100/200/300 include a local discharging path for the low-side power FETs 244/340 and causes a smallest transition time of a gate voltage during a turn-off cycle of the low-side power FETs 244/340. A small transition time allows tight control of dead time, which in turn will reduce diode conduction loss. A likewise advantage is realized for the high-side power FETs 242/341.

Figure 7:
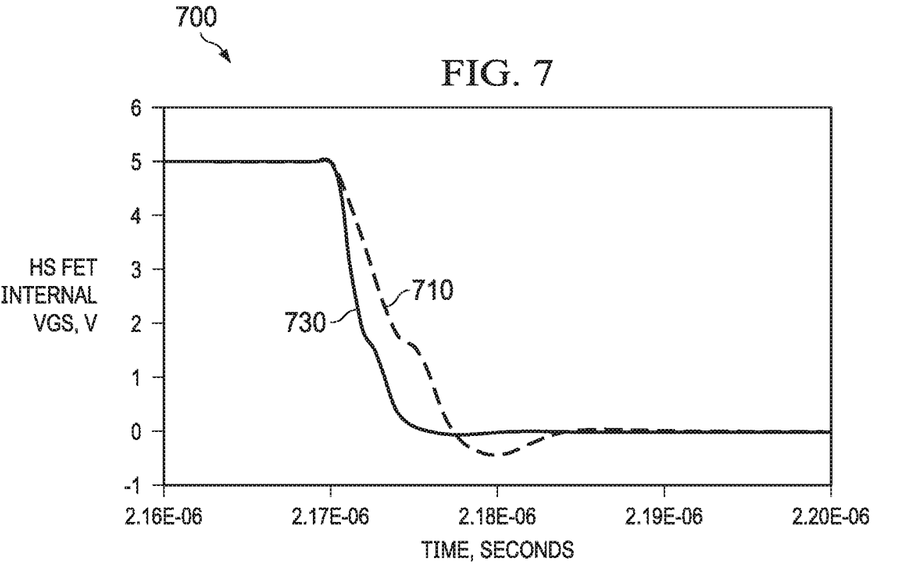
FIG. 7 illustrates an example graph of gate-to-source voltage for a high-side power FET.

FIG. 7 illustrates an example graph 700 of gate-to-source voltage for a high-side power FET, e.g., the high-side power FETs 242/341 of circuitry 200/300. Curve 710 represents values associated with a typical pull-down implementation discussed above and curve 730 represents values associated with implementation of the circuitry 100/200/300, without optional FETs 323/322. Curves 710/730 transition from their peak of approximately 5 V at $2.17^{-06}$ seconds to its minimum of 0 V at $2.184^{-06}$ seconds. However, curve 710 settles at 0 V after overshooting the 0 V between $2.178^{-06}$ and $2.184^{-06}$ seconds. In contrast, curve 730 settles at 0 V without such overshoot. Additionally, the slope of curve 630 is greater than curve 710 between $2.17^{-06}$ seconds and $2.178^{-06}$ seconds, with curve 730 illustrating that high-side power FET (e.g., FET 221/341) switches off more quickly with implementation of the circuits 200/300. The high-side power FETs 242/341 of the circuits 100/200/300 are hard switching switches, with their switching loss being a large part of power loss within the circuits 100/200/300. As illustrated, the gate-to-source voltage fall time for the high-side power FET 242/341 of the circuits 200/300 is reduced by approximately 2.28 ns. Thus, the circuits 200/300 disclosed herein mitigate high-side switching loss at the turn-off cycle of the high-side power FETs 242/341.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. An integrated circuit package comprising:
    (a) a ground lead frame, a voltage input, and an output terminal;
    (b) a driver circuit die mounted on the ground lead frame, the driver circuit die having bond pads including a first driver bond pad, a second driver bond pad, a third driver bond pad, and a fourth driver bond pad;
    (c) a low-side power die separate from the driver circuit die, the low-side power die being mounted on the ground lead frame, the low-side power die including:
        a low-side power transistor having a drain, having a gate coupled to a first low-side bond pad, and having a source coupled to the ground lead frame; and
        a low-side pull-down transistor having a drain coupled to the gate of the low-side power transistor, having a gate coupled to a second low-side bond pad, and having a source coupled to the ground lead frame;
    (d) a low-side clip disposed on the low-side power die, the low-side clip being coupled to the drain of the low-side power transistor and to the output terminal;
    (e) a high-side power die separate from the driver circuit die and separate from the low-side power die, the high-side power die including:
        a high-side power transistor having a drain, having a gate coupled to a first high-side bond pad, and having a source coupled to the output terminal through the low-side clip; and
        a high-side pull-down transistor having a drain coupled to the gate of the high-side power transistor, having a gate coupled to a second high-side bond pad, and having a source coupled to the output terminal through the low-side clip;
    (f) a high-side clip disposed on the high-side power die, the high-side clip being coupled to the drain of the high-side power transistor and to the voltage input; and
    (g) a first bond wire extending from the first driver bond pad to the first high-side bond pad, a second bond wire extending from the second driver bond pad to the second high-side bond pad, a third bond wire extending from the third driver bond pad to the first low-side bond pad, and a fourth bond wire extending from the fourth driver bond pad to the second low-side bond pad.

2. The integrated circuit package of claim 1 in which the low-side clip is made of copper.

3. The integrated circuit package of claim 1 in which the high-side clip is made of copper.

4. The integrated circuit package of claim 1 in which the driver circuit die is disposed in a corner of the ground lead frame along one outside edge, and the low-side power die is disposed along the one outside edge of the ground lead frame.

5. The integrated circuit package of claim 1 in which the power transistors are field effect transistors.

6. The integrated circuit package of claim 1 in which the pull down transistors are field effect transistors.

7. The integrated circuit package of claim 1 in which the power transistors are n-channel metal-oxide-semiconductor field effect transistors.

8. The integrated circuit package of claim 1 in which the pull down transistors are n-channel metal-oxide-semiconductor field effect transistors.

9. The integrated circuit package of claim 1 in which the power transistors include bulk and source terminals that are coupled together.

10. The integrated circuit package of claim 1 in which the pull down transistors including bulk and source terminals that are coupled together.

11. The integrated circuit package of claim 1 in which the driver circuit die includes control circuitry having a first driver output coupled to the first driver bond pad, a second driver output coupled to the second driver bond pad, a third driver output coupled to the third driver bond pad, and a fourth driver output coupled to the fourth driver bond pad.

12. The integrated circuit package of claim 11 in which the driver circuit die includes:
    a high-side pull up transistor having a drain coupled to a positive drain voltage terminal, having a gate coupled to the first driver output, and having a source coupled to the first driver bond pad; and a low-side pull up transistor having a drain coupled to the positive drain voltage terminal, having a gate coupled to the third driver output, and having a source coupled to the third driver bond pad.

13. The integrated circuit package of claim 12 in which the high-side pull up transistors of the driver circuit die are field effect transistors.

14. The integrated circuit package of claim 11 in which the driver circuit die includes:
   a high-side pull up transistor having a source coupled to a positive voltage terminal, having a gate coupled to the first driver output, and having a drain coupled to the first driver bond pad;
   a high-side pull down transistor having drain coupled to the first driver bond pad, having a gate coupled to the second driver output, and having a source coupled to the output terminal;
   a low-side pull up transistor having a source coupled to the positive voltage terminal, having a gate coupled to the third driver output, and having a drain coupled to the third driver bond pad; and
   a low-side pull down transistor having drain coupled to the third driver bond pad, having a gate coupled to the fourth driver output, and having a source coupled to the ground lead frame.

15. The integrated circuit package of claim 14 in which the pull up and pull down transistors of the driver circuit die are field effect transistors.

* * * * *